United States Patent
Farooqui et al.

(10) Patent No.: US 7,477,109 B2
(45) Date of Patent: Jan. 13, 2009

(54) PROCESS AND TEMPERATURE-COMPENSATED TRANSIMPEDANCE AMPLIFIER

(76) Inventors: Arshad Suhail Farooqui, Suite G02, 2320 Century Square, Jalan Usahawan, Cyberjaya (MY) 63000; Lee Wen Ying, No. 61, Lorong Nikmat 3, Happy Garden, Jalan Klang Lama, Kuala Lampur (MY) 58200

( * ) Notice: Subject to any disclaimer, the term of this patent is extended or adjusted under 35 U.S.C. 154(b) by 581 days.

(21) Appl. No.: 11/168,812

(22) Filed: Jun. 28, 2005

(65) Prior Publication Data

US 2006/0067713 A1    Mar. 30, 2006

Related U.S. Application Data

(60) Provisional application No. 60/613,370, filed on Sep. 27, 2004.

(51) Int. Cl.
*H03F 3/08* (2006.01)

(52) U.S. Cl. .................... 330/308; 398/209; 250/214 A (58) Field of Classification Search ................ 330/308, 330/98–100; 250/214 A, 214 AG
See application file for complete search history.

(56) References Cited

U.S. PATENT DOCUMENTS 7,105,797 B2 *   9/2006   Kimura ................... 250/214 A 2004/0036536 A1   2/2004   Gupta

OTHER PUBLICATIONS

Bahram Zand et al., Transipendance Amplifier with Differential Photodiode Current Sensing, University of Toronto, pp. II-624-II-627, Toronto, Ontario, Canada.

* cited by examiner

*Primary Examiner*—Robert Pascal
*Assistant Examiner*—Hieu P Nguyen
(74) *Attorney, Agent, or Firm*—DeMont & Breyer, LLC (57) ABSTRACT

An optical receiver is disclosed that exhibits an improved phase margin and substantially constant output in response to changes in operating conditions (e.g., temperature, process, etc.). In accordance with the illustrative embodiment, a common-mode feedback comparison is performed prior to conversion of the signal from single-ended to differential voltage. When the common-mode feedback comparison is performed in this way, there are fewer amplifiers in the signal path and the phase margin of the common-mode feedback loop is increased. In addition, as the common-mode feedback is performed at the first stage of the transimpedance amplifier, the gain response of the transimpedance amplifier remains substantially constant in response to changes in temperature, input current range, and for different integrated circuit fabrication processes.

4 Claims, 6 Drawing Sheets

PROCESS AND TEMPERATURE-COMPENSATED TRANSIMPEDANCE AMPLIFIER

REFERENCE TO RELATED APPLICATIONS

This application claims the benefit of U.S. Provisional 60/613,370, filed Sep. 27, 2004, which is also incorporated by reference.

FIELD OF THE INVENTION

The present invention relates to electronics in general, and, more particularly, to transimpedance amplifiers.

BACKGROUND OF THE INVENTION

Figure 1:
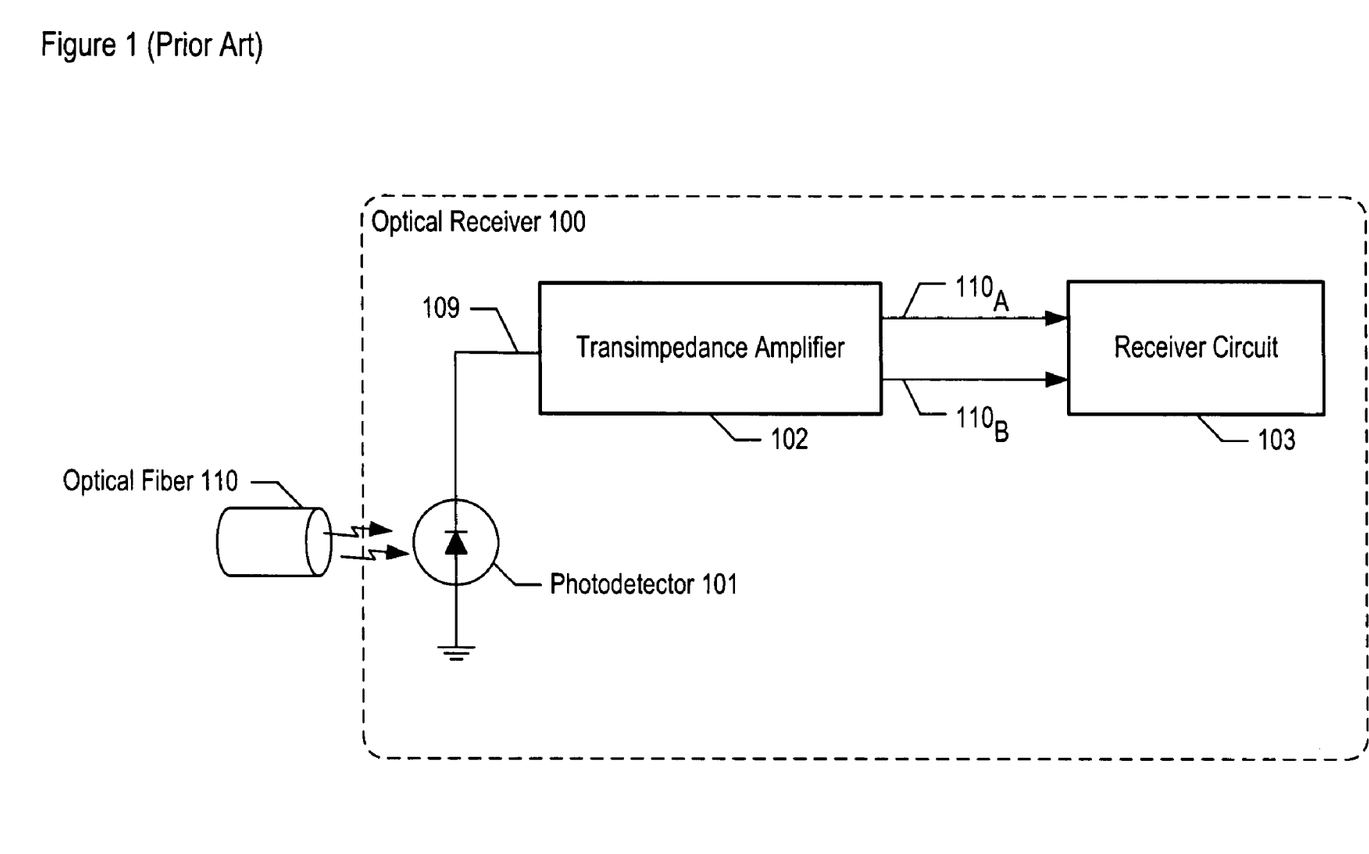
FIG. 1 depicts the salient components of an optical telecommunications system that utilizes an optical receiver as is known in the prior art.

FIG. 1 depicts the salient components of an optical telecommunications system in the prior art. The system comprises: optical fiber 110 and optical receiver 100, which itself comprises: photodetector 101, transimpedance amplifier 102, and receiver circuit 103. Optical fiber 110 is used to carry optical signals, and optical receivers are used in optical communications systems to detect and convert optical signals into electrical signals that can be processed by electronic systems or converted into sound.

Photodetector 101 is a device that receives light from optical fiber 110 and outputs an electrical current that is based on the intensity of the light. Transimpedance amplifier 102 converts the current signal from photodetector 101 into a voltage signal for receiver circuit 103. Receiver circuit 206 comprises electronics for processing the input signal in preparation for output to the rest of a processing system.

The quality of the output of the optical receiver is measured by a parameter known as the signal-to-noise ratio, which is the ratio of the magnitude of the output signal to the magnitude of the noise output by the optical receiver. Each component in transimpedance amplifier 102 is a source of some of the noise, and the manner in which transimpedance amplifier 102 is designed affects the quantity and quality of the noise.

Figure 2:
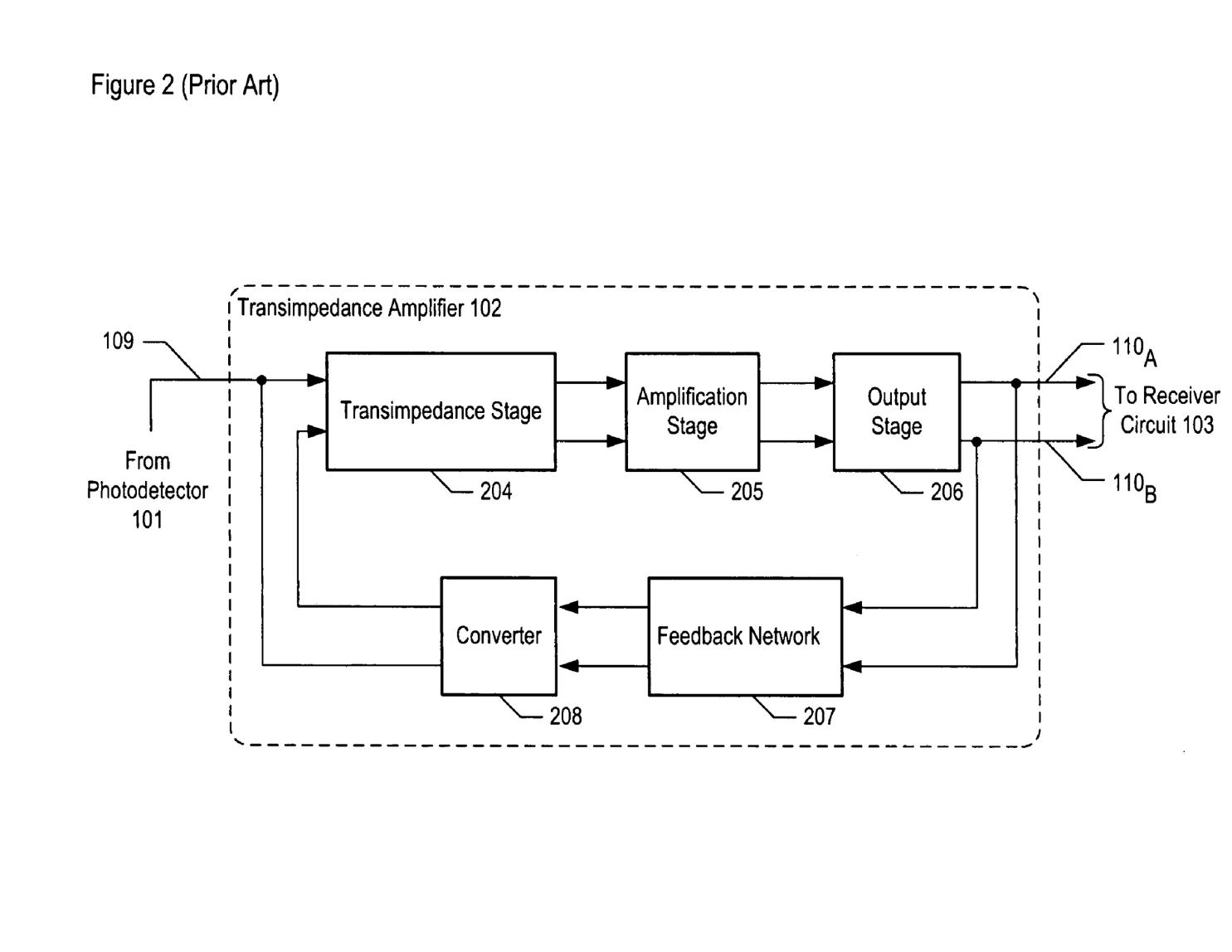
FIG. 2 depicts the salient components of a transimpedance amplifier, as is known in the prior art.

FIG. 2 depicts the salient components of transimpedance amplifier 102 in the prior art. Transimpedance amplifier 102 comprises transimpedance stage 204, amplification stage 205, output stage 206, feedback network 207, and converter 208. The input current signal from photodetector 101 is carried on line 109 to one of two inputs of transimpedance stage 204. Transimpedance stage 204 converts the input current signal into a differential voltage signal (i.e. the signal comprises the difference between the voltages carried individually on each of two lines). Amplification stage 205, which provides amplification of the voltage signal (i.e. gain), amplifies the differential voltage in a manner well-known to those skilled in the art. Output stage 206 provides an appropriate interface between the output of amplification stage 205 and receiver circuit 103, in a manner well-known to those skilled in the art.

The differential voltage output signal on output lines $110_A$ and $110_B$ comprises a noise component known as Common-Mode Voltage. This common-mode voltage causes a voltage offset of the signal that degrades the performance of transimpedance amplifier 102. Feedback network 207 is positioned between the differential output of transimpedance amplifier 102 (i.e., the output of output stage 206) and the two inputs of transimpedance stage 204 for the purpose of canceling the voltage offset associated with the common-mode voltage. Converter 208 converts the voltage signals on each of the two output lines of feedback network 207 into current signal inputs for transimpedance stage 204. In some cases, converter 208 is included as part of transimpedance stage 204, and in other cases it is included as part of feedback network 207.

Since feedback network 207 spans the entire topology of the signal path of transimpedance amplifier 102, the total phase shift in the feedback signal is equal to the sum of the phase shift contributed by each of the components in the signal path. The signal-to-noise ratio of transimpedance amplifier 102 is, therefore, degraded by the phase shift associated with the feedback signal.

Transimpedance amplifier 102 is required to provide enough amplification to provide an input signal to receiver circuit 103 with a suitable voltage level. However, too much noise is introduced into the output signal of transimpedance amplifier 102 if transimpedance stage 204 has a transimpedance gain that is too high. These competing requirements lead to a need to include amplification stage 205, and they also determine the magnitude of signal amplification required of amplification stage 205. Similarly, the gain of any one amplifier included in amplification stage 205 should be kept relatively low so as to reduce generated noise on the signal. As a result, in order to obtain sufficient amplification from amplification stage 205 to ensure maximum signal strength at the input of output stage 206, amplification stage 205 comprises a cascade of many limiting amplifiers—each of which introduces some amount of phase shift which further degrades the signal-to-noise ratio of transimpedance amplifier 102.

It is often difficult build a transimpedance amplifier with a lot of gain, but low phase shift, and, therefore, a trade-off exists between gain and phase shift. Furthermore, it is challenging to suppress the voltage offset caused by the common-mode voltage without inducing phase shift.

Therefore, the need exists for an optical receiver that avoids or mitigates some or all of these problems.

SUMMARY OF THE INVENTION

The present invention enables an optical receiver that avoids some of the costs and disadvantages found in the prior art. In particular, the illustrative embodiment comprises a transimpedance that exhibits an improved phase margin and substantially constant output in response to changes in operating conditions (e.g., temperature, process, etc.).

In accordance with the illustrative embodiment, a common-mode feedback comparison is performed prior to conversion of the signal from single-ended to differential voltage. When the common-mode feedback comparison is performed in this way, there are fewer amplifiers in the signal path and the phase margin of the common-mode feedback loop is increased. In addition, as the common-mode feedback is performed at the first stage of the transimpedance amplifier, the gain response of the transimpedance amplifier remains substantially constant in response to changes in temperature, input current range, and for different integrated circuit fabrication processes.

The illustrative embodiment comprises an optical telecommunications system comprising: (1) an optical fiber; (2) a photodetector for generating an electric current based on an optical signal from said optical fiber; (3) a transimpedance amplifier for generating an output voltage based on said electric current; and (4) a receiver circuit for processing said output voltage; wherein said transimpedance amplifier comprises: (a) an amplification stage comprising a first input, a second input, a first output, and a second output; and (b) a feedback network comprising an input, a first output, and a second output; wherein said first input of said amplification stage is also said input of said feedback network; and wherein said second input of said amplification stage is said second output of said feedback network.

DETAILED DESCRIPTION

Figure 3:
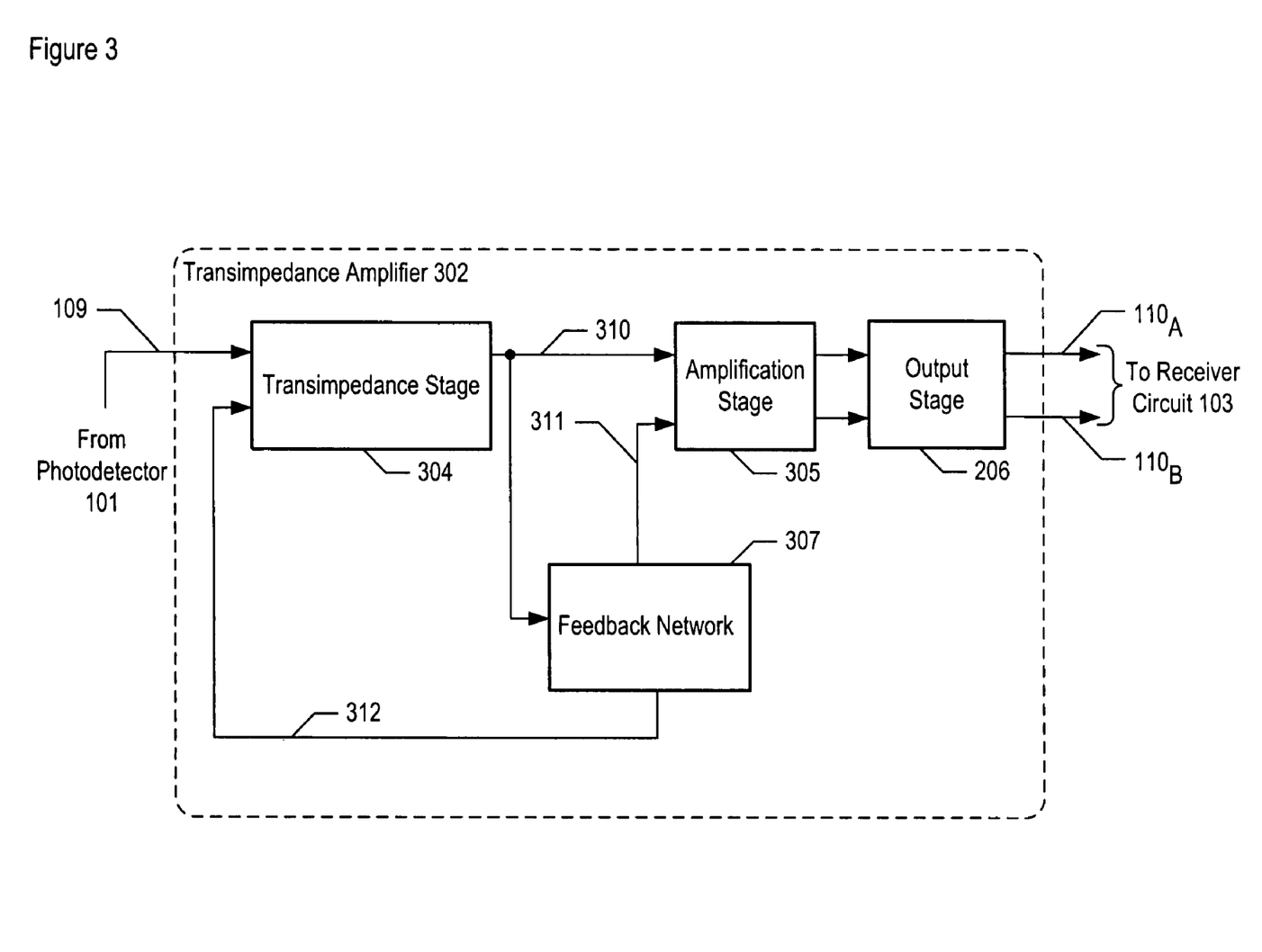
FIG. 3 depicts a schematic diagram of the salient components of a transimpedance amplifier in accordance with the illustrative embodiment of the present invention.

FIG. 3 depicts a schematic diagram of the salient components of transimpedance amplifier 302 in accordance with the illustrative embodiment of the present invention. In accordance with the illustrative embodiment, transimpedance amplifier 302 exhibits a gain of 104 dBΩ. It will be clear to those skilled in the art, however, after reading this specification, how to make and use embodiments of the present invention that have a different gain.

Transimpedance amplifier 302 comprises: transimpedance stage 304 (comprising signal input 109, bias input 312, and output 310, amplification stage 305, output stage 206, and feedback network 307, interconnected as shown.

Transimpedance stage 304 converts a current at its signal input into a single-ended voltage signal at its output. In accordance with the illustrative embodiment, transimpedance stage 304 has a transimpedance gain of 60 dBΩ. The details of transimpedance stage 304 are described in detail below and with respect to FIG. 6.

Amplification stage 305 amplifies the voltage difference between its first and second inputs and provides a differential input signal on its first and second outputs to output stage 206. The gain of amplification stage 305 is determined by the gain of transimpedance amplifier 302. The details of amplification stage 305 are described in detail below and with respect to FIG. 4.

Output stage 206 provides an impedance-matched differential signal path between amplification stage 305 and the input load impedance of receiver circuit 103. It will be clear to those skilled in the art how to make and use output stage 206.

Feedback network 307 provides a common-mode feedback (CMFB) path that is used to affect the biasing of transimpedance stage 304. This is desirable because it enables a desired common mode voltage shift at the output of output stage 206. The details of feedback network 307 are described in detail below and with respect to FIG. 5.

Figure 4:
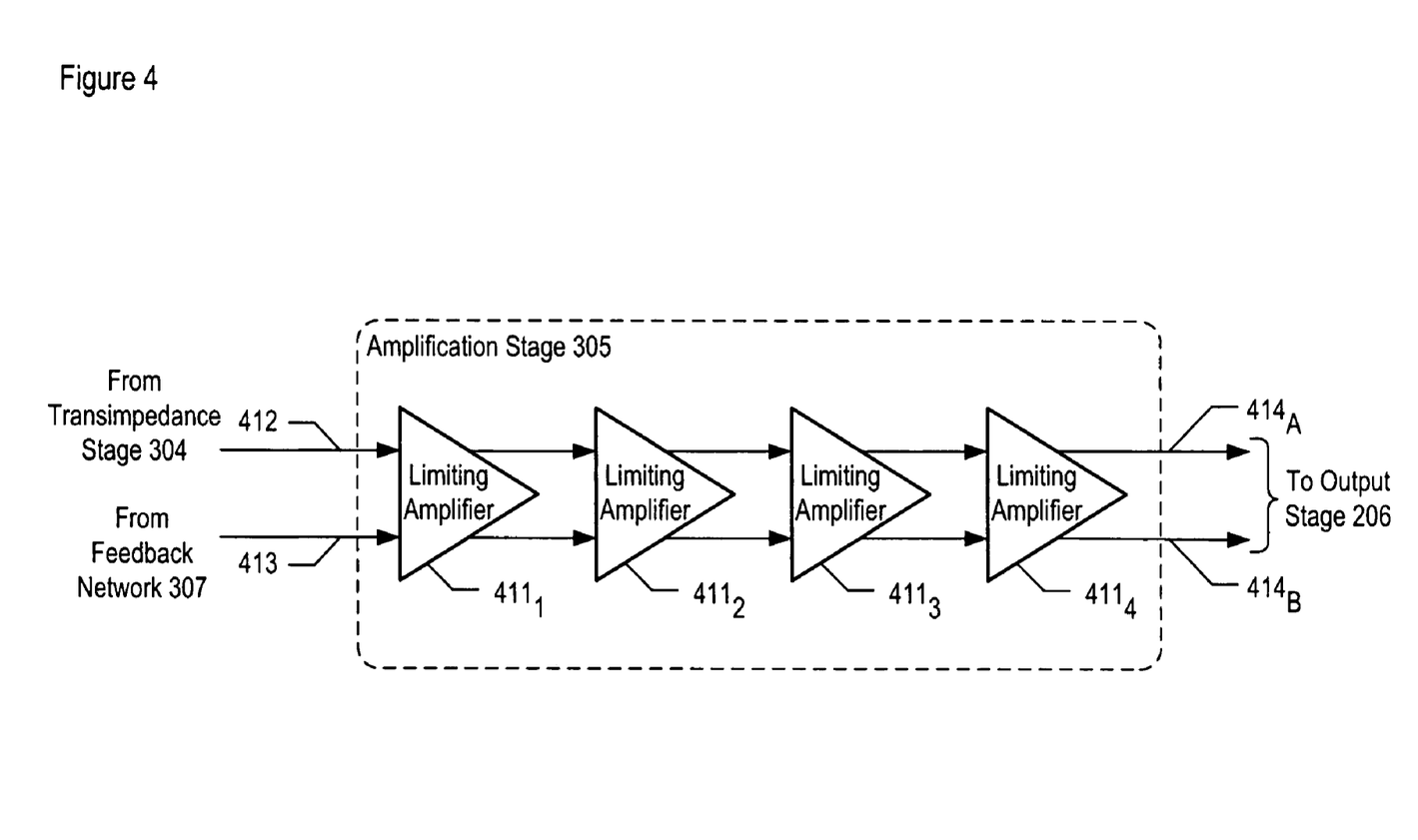
FIG. 4 depicts a schematic diagram of the salient components of an amplification stage in accordance with the illustrative embodiment of the present invention.

FIG. 4 depicts a schematic diagram of the salient components of amplification stage 305 in accordance with the illustrative embodiment of the present invention. Amplification stage 305 comprises four differential limiting amplifiers, $411_1$ through $411_4$, interconnected as shown.

Each of limiting amplifiers $411_1$ through $411_4$ comprises a differential input and a differential output. The gain of each of limiting amplifiers $411_1$ through $411_4$ is 11 dB, and, therefore, amplification stage 305 has a total gain of 44 dB.

Although the illustrative embodiment uses four differential limiting amplifiers, it will be clear to those skilled in the art, however, after reading this specification, how to make and use embodiments of the present invention which:

i. use any number of amplifiers, or ii. use any kind of amplifier (e.g., non-differential, non-limiting, etc.), or iii. any combination of i and ii.

Moreover, although limiting amplifiers $411_1$ through $411_4$ do not comprise individual feedback loops to maintain their individual common mode voltages, it will be clear to those skilled in the art, after reading this specification, how to make and use alternative embodiments of the present invention in which amplification stage 305 comprises one or more limiting amplifiers that each comprise an individual feedback loop to maintain its individual common mode voltage.

Figure 5:
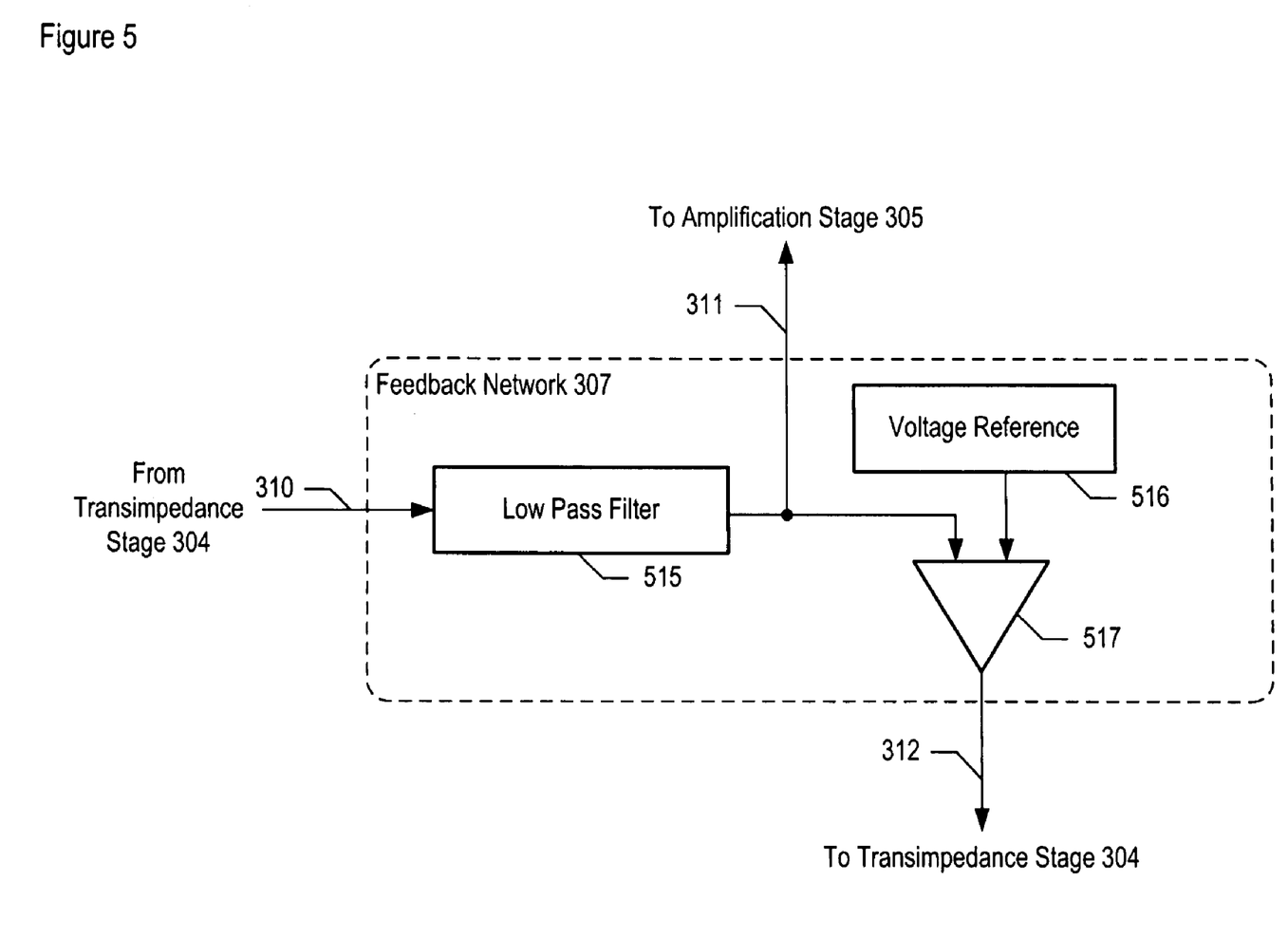
FIG. 5 depicts a schematic diagram of the salient components of a feedback network in accordance with the illustrative embodiment of the present invention.

FIG. 5 depicts a schematic diagram of the salient components of feedback network 307 in accordance with the illustrative embodiment of the present invention. Feedback network 307 provides a common-mode feedback comparison for transimpedance amplifier 302, wherein the comparison is performed before the signal is converted from single-ended to differential voltage. Since the comparison is performed before the signal passes through amplification stage 305, the phase margin of the feedback loop is improved. Feedback network 307 comprises: low-pass filter 515, voltage reference 516, and differential amplifier 517, interconnected as shown.

Low-pass filter 515 comprises a unity-gain buffer followed by a resistor and capacitor low-pass filter combination as is well-known by those skilled in the art. The output of low-pass filter 515 is electrically connected to the second input of amplification stage 305 and the first input of differential amplifier 517. Low-pass filter 515 passes the low-frequency components of signal 310 to amplification stage 305 as one of two differential inputs such that the output of amplification stage 305 comprises just those frequency components higher than the cut-off frequency of low-pass filter 515.

The output of low-pass filter 515 is also electrically connected to the first input of differential amplifier 517, which acts as a comparator that compares the output of low-pass filter 515 to voltage reference 516, wherein voltage reference 516 is chosen to be substantially equal to 1.32 V. The voltage of voltage reference 516 is chosen so as to be suitable to keep limiting amplifier $411_1$ in proper operational region. The voltage choice depends upon the desired gain and bandwidth of transimpedance amplifier 302, and it will be clear to those skilled in the art, after reading this specification, how to make and use embodiments of the present invention that utilize a voltage reference that has a different voltage. The output of differential amplifier 517 is electrically connected to the second (i.e., bias) input of transimpedance stage 304 as depicted in FIGS. 3 and 6.

Although low-pass filter 515 comprises an operational amplifier-based unity-gain buffer followed by a resistor and capacitor low-pass filter combination, it will be clear to those skilled in the art, after reading this specification, how to make and use embodiments of the present invention wherein low-pass filter 515 comprises a Butterworth filter, a Chebyshev Filter, or other suitable low-pass filter.

Feedback network 307 and transimpedance stage 304 form a negative feedback loop for transimpedance amplifier 302, wherein the feedback loop has a phase margin of 60 dB. An important consideration for the negative feedback loop is that it has a positive phase margin for amplifier operation to be stable. The gain of transimpedance stage 304 is 60 dB, the gain of the operational amplifier of the unity-gain buffer in low-pass filter 515 is 50 dB, and the gain of differential amplifier 517 is 40 dB, therefore the feedback loop is stable. It will be clear to those skilled in the art, after reading this specification, how to make and use alternative embodiments of the present invention comprising stable feedback loops that have different individual component gain values.

Figure 6:
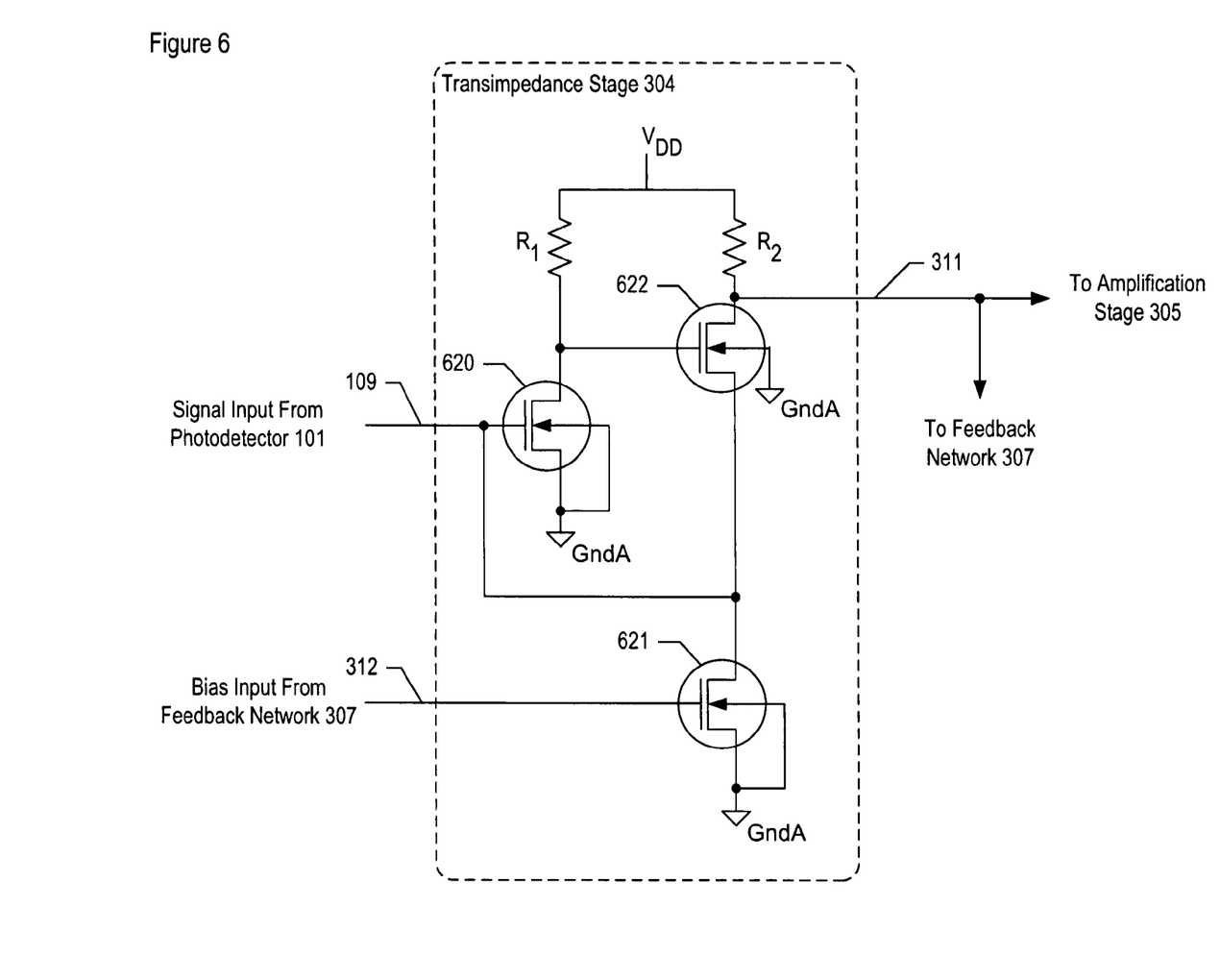
FIG. 6 depicts a circuit schematic comprising the salient components of the illustrative embodiment of a transimpedance stage in accordance with the present invention.

FIG. 6 depicts a schematic of the salient components of transimpedance stage 304 in accordance with the illustrative embodiment of the present invention. Transimpedance stage 304 comprises: transistor 620, transistor 621, and transistor 622, resistor $R_1$, and resistor $R_2$, interconnected as shown.

Transimpedance stage 304 converts and amplifies input current signal 109 from photodetector 101 into single-ended voltage signal 310, which is applied to the first input of amplification stage 205 and the input of feedback network 307.

Transistors 620, 621, and 622 are fabricated in a 0.18 μm-CMOS process. Transistor 620 comprises a gate that has a width and a length of 16.56 μm and 0.18 μm, respectively. Transistor 621 comprises a gate that has a width and a length of 6.98 μm and 0.18 μm, respectively. Transistor 622 comprises a gate that has a width and a length of 17.72 μm and 0.18 μm, respectively. $R_1$ has a resistance of 1000Ω, and $R_2$ has a resistance of 700Ω. It will be clear to those skilled in the art how to make and use transistors 620, 621, and 622, and resistors $R_1$ and $R_2$.

The input impedance of transimpedance stage 304 is a function of the gain of transistor 620 and the value of resistor $R_1$. It is desirable to have an input impedance of transimpedance stage 304 that matches the impedance of photodetector 101, which is 30 to 50 Ohms. Therefore, resistor $R_1$ has a value substantially equal to 1000Ω and resistor $R_2$ has a value substantially equal to 700Ω. It will be clear to those skilled in the art, after reading this specification, how to make and use alternative embodiments of the present invention that utilize resistors that have other values of resistance.

Although transistors 620, 621, and 622 are CMOS transistors fabricated in a 0.18 μm-CMOS process, it will be clear to those skilled in the art, after reading this specification, how to make and use embodiments of the present invention that comprise transistors made in any CMOS technology, or any other suitable IC fabrication technology.

It is to be understood that the above-described embodiments are merely illustrative of the present invention and that many variations of the above-described embodiments can be devised by those skilled in the art without departing from the scope of the invention. For example, in this Specification, numerous specific details are provided in order to provide a thorough description and understanding of the illustrative embodiments of the present invention. Those skilled in the art will recognize, however, that the invention can be practiced without one or more of those details, or with other methods, materials, components, etc.

Furthermore, in some instances, well-known structures, materials, or operations are not shown or described in detail to avoid obscuring aspects of the illustrative embodiments. It is understood that the various embodiments shown in the Figures are illustrative, and are not necessarily drawn to scale. Reference throughout the specification to "one embodiment" or "an embodiment" or "some embodiments" means that a particular feature, structure, material, or characteristic described in connection with the embodiment(s) is included in at least one embodiment of the present invention, but not necessarily all embodiments. Consequently, the appearances of the phrase "in one embodiment," "in an embodiment," or "in some embodiments" in various places throughout the Specification are not necessarily all referring to the same embodiment. Furthermore, the particular features, structures, materials, or characteristics can be combined in any suitable manner in one or more embodiments. It is therefore intended that such variations be included within the scope of the following claims and their equivalents.

What is claimed is:

1. An apparatus comprising:
   (1) an amplification stage comprising a first input, a second input, a first output, and a second output;
   (2) a feedback network comprising an input, a first output, and a second output;
   wherein said first input of said amplification stage is also said input of said feedback network; and
   wherein said second input of said amplification stage is said second output of said feedback network;
   (3) a transimpedance stage comprising a signal input, a bias input, and an output;
   wherein said bias input of transimpedance stage is based on first output of said feedback network;
   wherein said first input of said amplification stage is based on said output of said transimpedance stage; and
   wherein said input of said feedback network is based on said output of said transimpedance stage;
   wherein said transimpedance stage comprises:
   (a) a first transistor comprising a gate, a drain, a source, and
   (b) a second transistor comprising a gate, a drain, and a source;
   wherein said gate of said first transistor is electrically connected to said signal input of said transimpedance stage;
   wherein said gate of said second transistor is electrically connected to said bias input of said transimpedance stage;
   wherein said source of said first transistor is electrically connected to a common voltage;
   wherein said source of said second transistor is electrically connected to a common voltage; and
   wherein said gate of said first transistor is electrically connected to said drain of said second transistor.

2. The apparatus of claim 1 wherein said transimpedance stage further comprises:
   (c) a third transistor comprising a gate, a drain, and a source;
   wherein said gate of said third transistor is electrically connected to said drain of said first transistor;
   wherein said source of said third transistor is electrically connected to said drain of said second transistor; and
   wherein said drain of said third transistor is electrically connected to said first input of said amplification stage.

3. An apparatus comprising:
   (1) an amplification stage comprising a first input, a second input, a first output, and a second output;
   (2) a feedback network comprising an input, a first output, and a second output;
   wherein said first input of said amplification stage is also said input of said feedback network; and
   wherein said second input of said amplification stage is said second output of said feedback network;
   (3) a transimpedance stage comprising a signal input, a bias input, and an output;
   wherein said bias input of transimpedance stage is based on first output of said feedback network;
   wherein said first input of said amplification stage is based on said output of said transimpedance stage; and
   wherein said input of said feedback network is based on said output of said transimpedance stage;
   wherein said transimpedance stage comprises:

(a) a first transistor comprising a gate, a drain, and a source; and (b) a second transistor comprising a gate, a drain, and a source;

wherein said drain of said first transistor is electrically connected to said signal input of said transimpedance stage;

wherein said gate of said first transistor is electrically connected to said bias input of said transimpedance stage;

wherein said drain of said first transistor is electrically connected to said source of said second transistor; and wherein said drain of said second transistor is electrically connected to said first input of said amplification stage.

4. An apparatus comprising:

(1) an amplification stage comprising a first input, a second input, a first output, and a second output;

(2) a feedback network comprising an input, a first output, and a second output;

wherein said first input of said amplification stage is also said input of said feedback network; and wherein said second input of said amplification stage is said second output of said feedback network;

(3) a transimpedance stage comprising a signal input, a bias input, and an output;

wherein said bias input of transimpedance stage is based on first output of said feedback network;

wherein said first input of said amplification stage is based on said output of said transimpedance stage; and wherein said input of said feedback network is based on said output of said transimpedance stage;

wherein said transimpedance stage comprises:

(a) a transistor comprising a gate, a drain, and a source;

(b) a first resistor comprising a first terminal and a second terminal; and (c) a second resistor comprising a first terminal and a second terminal;

wherein said gate of said transistor is electrically connected to said first terminal of said first resistor;

wherein said drain of said transistor is electrically connected to said first terminal of said second resistor;

wherein said drain of said transistor is electrically connected to said first input of said amplification stage;

wherein said source of said transistor is electrically connected to said signal input of said transimpedance stage;

wherein said second terminal of said first resistor is electrically connected to a voltage supply; and wherein said second terminal of said second resistor is electrically connected to said voltage supply.

* * * * *